US007208814B2

United States Patent
Pompl

(10) Patent No.: US 7,208,814 B2
(45) Date of Patent: Apr. 24, 2007

(54) RESISTIVE DEVICE AND METHOD FOR ITS PRODUCTION

(75) Inventor: Stefan Pompl, Altdorf (DE)

(73) Assignee: Infineon Technologies AG, Munich (DE)

( * ) Notice: Subject to any disclaimer, the term of this patent is extended or adjusted under 35 U.S.C. 154(b) by 139 days.

(21) Appl. No.: 10/922,367

(22) Filed: Aug. 20, 2004

(65) Prior Publication Data

US 2005/0077579 A1    Apr. 14, 2005

(30) Foreign Application Priority Data

Aug. 22, 2003   (DE)   ................. 103 38 689

(51) Int. Cl.
*H01L 29/00*   (2006.01)

(52) U.S. Cl. ............ 257/536; 257/358; 257/359; 257/360; 257/363; 257/379; 257/380; 257/381; 257/516; 257/537; 257/538; 257/539; 257/540; 257/541; 257/542; 257/543; 257/577; 257/904

(58) Field of Classification Search ........ 257/358–360, 257/363, 379–381, 516, 536–543, 577, 904
See application file for complete search history.

(56) References Cited

U.S. PATENT DOCUMENTS 3,725,821 A * 4/1973 Mitsui ................. 331/107 G
4,005,471 A   1/1977 Magdo et al. ............. 257/536
4,057,894 A * 11/1977 Khajezadeh et al. ........ 438/331
4,196,228 A *  4/1980 Priel et al. ................. 438/383
4,228,451 A * 10/1980 Priel et al. ................. 257/543
4,337,473 A   6/1982 Nishizawa ................. 257/264
4,642,620 A *  2/1987 Togashi et al. ............. 345/214
4,816,878 A *  3/1989 Kano et al. ................. 257/17
4,893,166 A   1/1990 Geekie ...................... 257/536
5,065,221 A  11/1991 Imamura ................... 257/538
5,498,892 A *  3/1996 Walker et al. ............. 257/336
5,559,346 A   9/1996 Kushida ..................... 257/138
5,986,922 A * 11/1999 Perumal ..................... 365/154

FOREIGN PATENT DOCUMENTS

DE       26 08 214         10/1976
EP       0 996 158 A1       4/2000
JP       07183496 A    *    7/1995

* cited by examiner

Primary Examiner—Ida M. Soward
(74) Attorney, Agent, or Firm—Maginot, Moore & Beck

(57) ABSTRACT

A resistive device includes a resistive region of a semiconductor material that includes a first region and a second region, wherein the first region has a higher dopant concentration than the second region, and wherein a resistance-determining width of a current path through the first region is determined by a portion of a doping boundary between the first region and the second region.

20 Claims, 4 Drawing Sheets

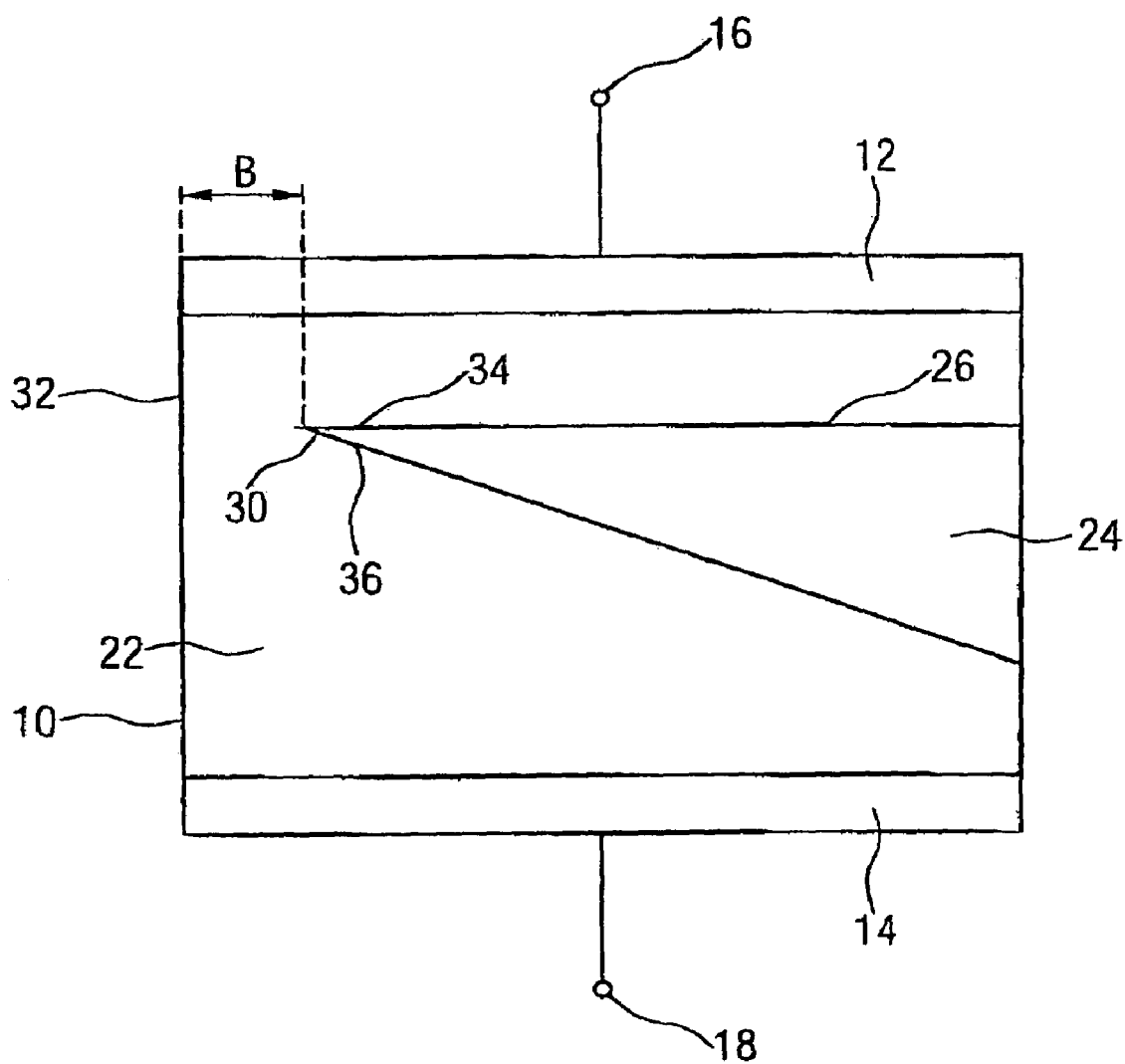

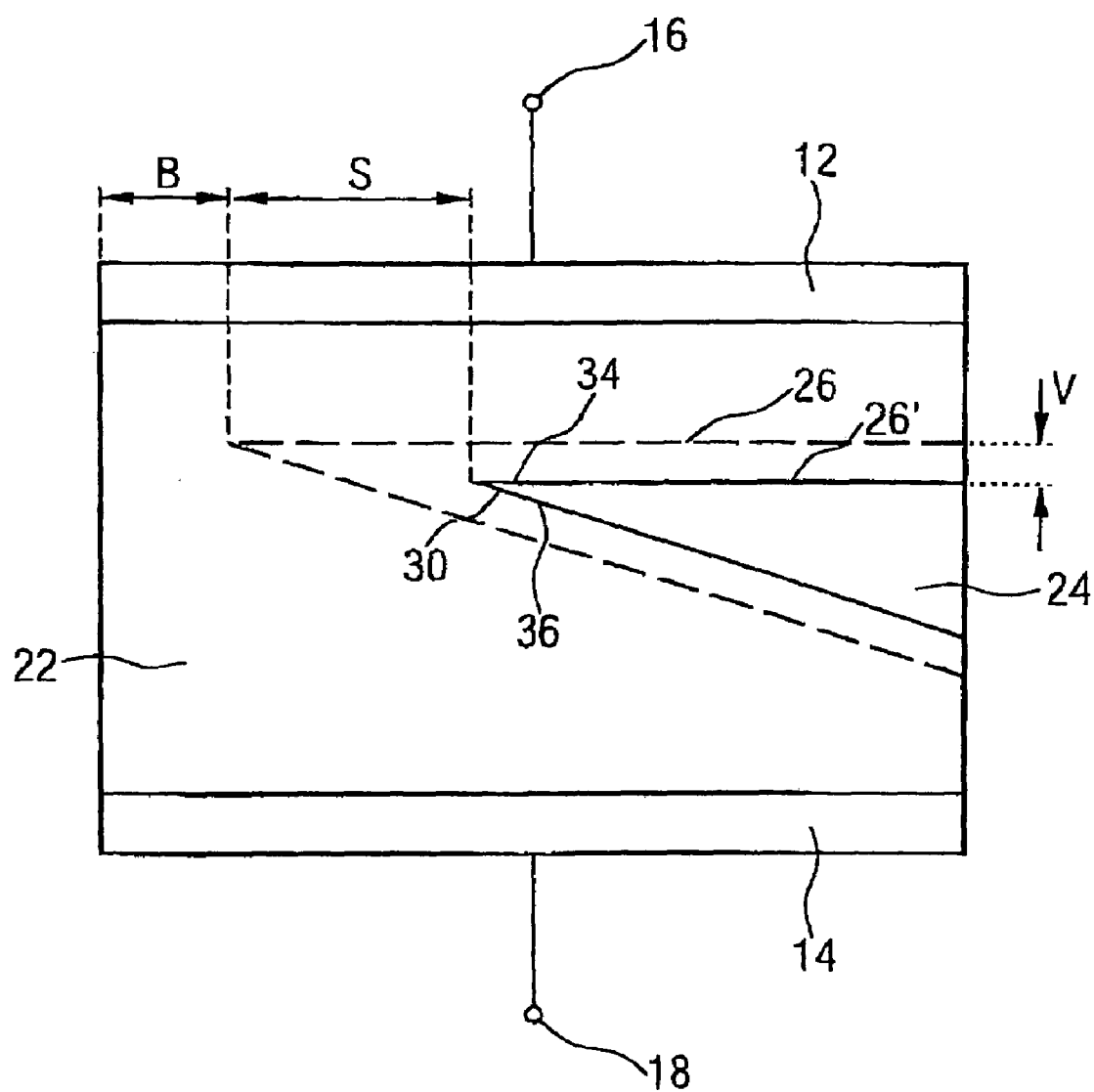

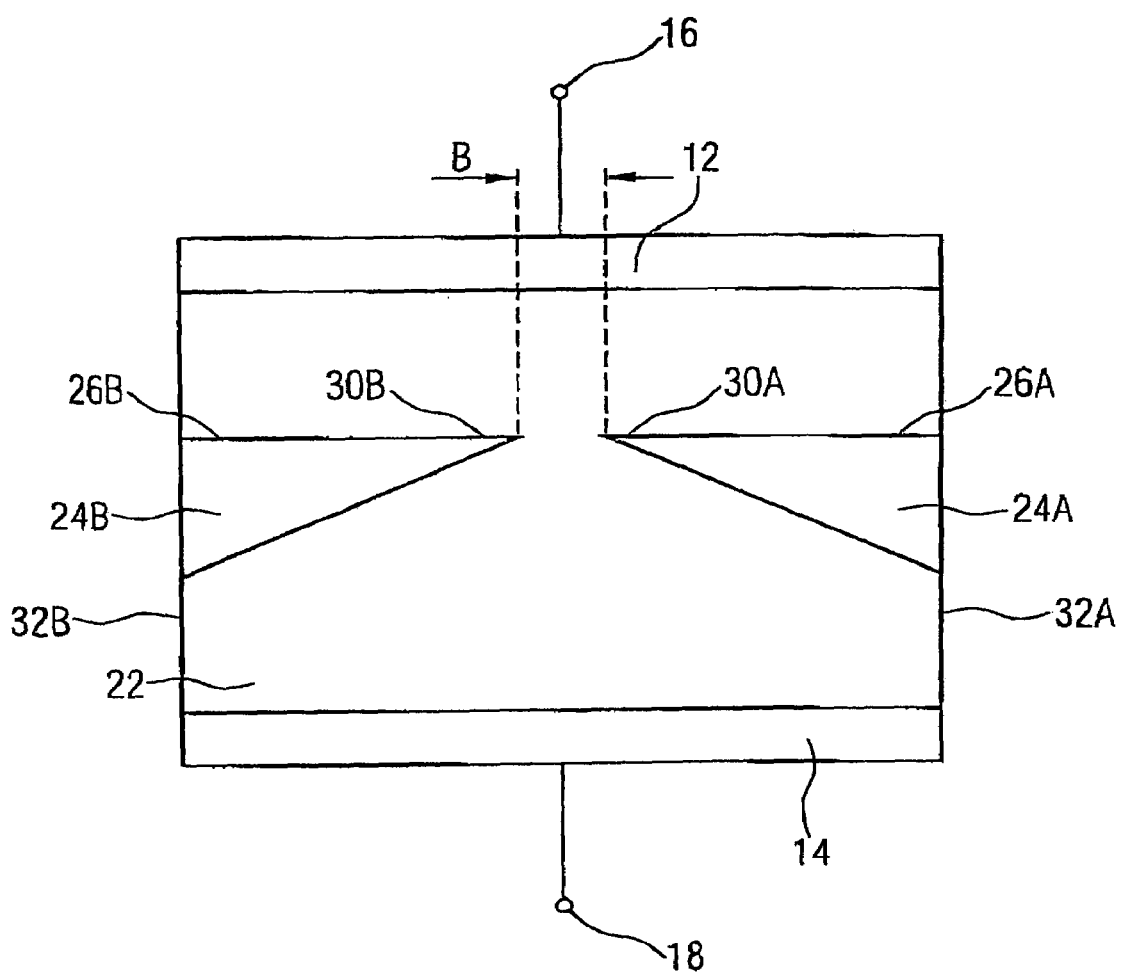

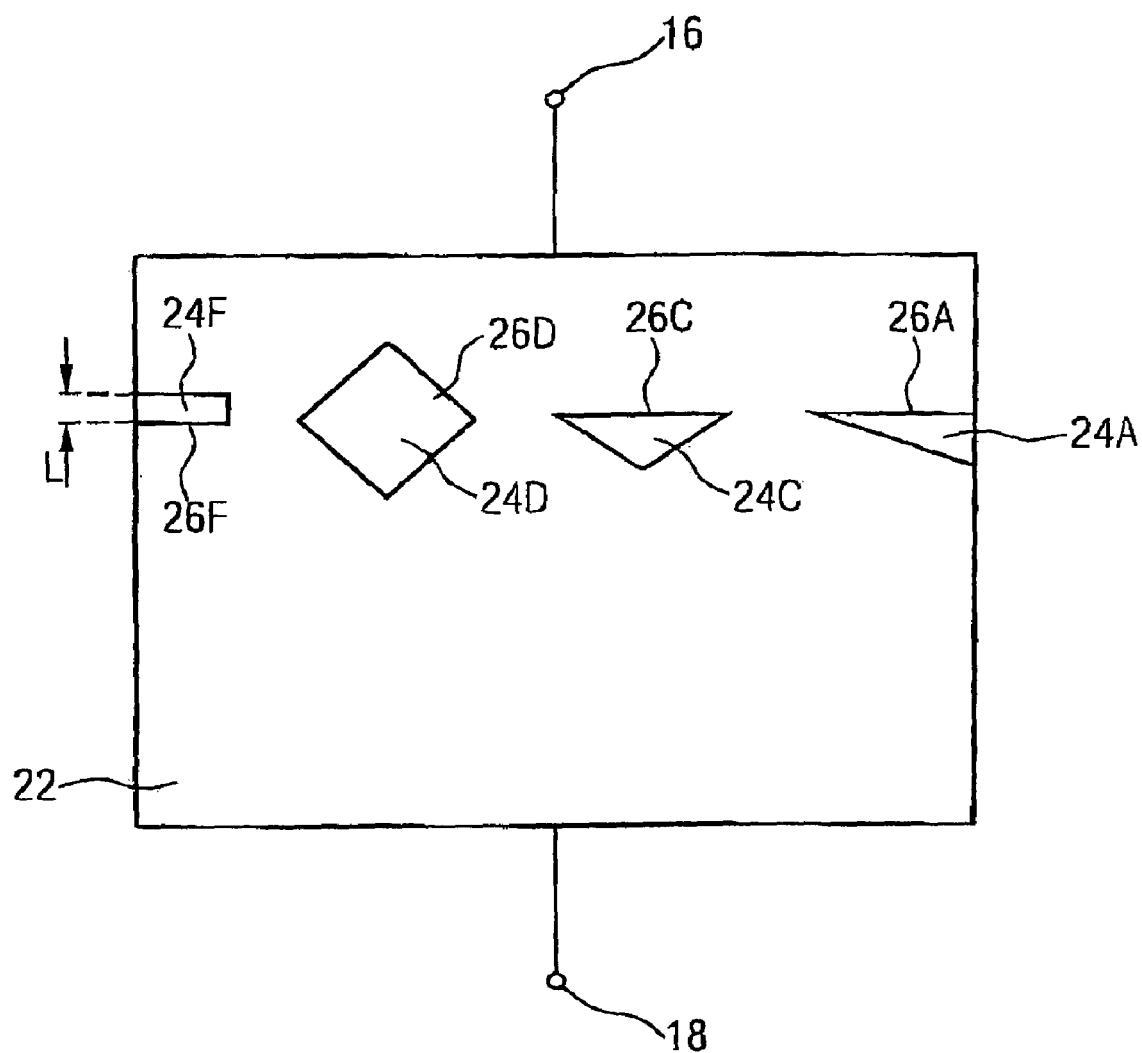

RESISTIVE DEVICE AND METHOD FOR ITS PRODUCTION

CROSS-REFERENCE TO RELATED APPLICATION

This application claims priority from German Patent Application No. 10338689.0, which was filed on Aug. 22, 2003, and is incorporated herein by reference in its entirety.

BACKGROUND OF THE INVENTION

1. Field of the Invention

The present invention relates to a resistive device whose electric resistance is adjustable as well as a method for its production.

2. Description of the Related Art

For numerous applications, resistive devices with a defined electric resistance must be produced in integrated circuits. There are several methods for the production of integrated resistive devices, which are, however, generally characterized either by a wide spread of the resistance values or by considerable processing requirements. In order to obtain a defined resistance value, resistive devices are often adjusted, or set, afterwards. Conventionally, however, this adjustment is only possible within a relatively small range.

An example of a conventional integrated resistive device is a film resistor. An insulating layer, for example a semiconductor oxide layer, is produced on a substrate. A thin semiconductor layer is deposited thereon and laterally structured. The thin semiconductor layer, or semiconductor film, is doped. A typical lateral shape of a film resistor is a rectangle. Along two parallel sides of the rectangle opposing each other, highly doped, for example $p^+$-doped, contact strips are provided, via which the resistive device is contacted. The rectangular region of the semiconductor film located between these highly doped contact strips is the actual resistive region. The resistive region is doped less than the highly doped contact strips, but it has the same line type. Therefore, if the contact strips are $p^+$-doped, the resistive region is preferably $p^-$-doped.

The doping of both the resistive region and the contact strips is generally performed by implantation of a dopant with subsequent thermal activation of the implanted dopant.

In a film resistor of the described design, there are several possibilities, with a given geometry of the resistive device and with a given number of implanted dopant atoms, to change the electric resistance. One possibility is to change, or to vary, the dopant activation. For that, the temperature profile of the thermal dopant activation is varied, particularly the duration and the achieved temperatures. An incomplete activation of the dopant causes an increased resistance of the resistive device, as, on the one hand, only part of the dopant atoms is in lattice positions and, there, acts as donators or acceptors, respectively, and, on the other hand, dopant atoms in intermediate lattice positions and other lattice defects of the semiconductor produced during implantation of the dopant and not annealed act as traps for charge carriers and thus reduce the charge carrier density.

Another possibility is to cause, by thermal treatment, an out-diffusion of dopant from the highly doped contact strips into adjacent regions of the low-doped resistive region. Thereby the conductivity of the highly doped contact strips decreases only slightly, while the conductivity of the low-doped resistive region, at least near the highly doped contact strips, increases noticeably. The electric resistance of the resistive device is thereby reduced. Such an out-diffusion of dopant from the highly doped contact strips into the low-doped resistive region may be performed as early as in the process step of the dopant activation. By increasing the temperature or extending the duration of the dopant activation, an (increased) out-diffusion of dopant from the highly doped contact strips into the low-doped resistive region and hence a reduction of the electric resistance of the resistive device may thus be caused.

Another possibility is to produce, within the resistive device and particularly within the resistive region, first a dopant concentration that is non-homogeneous in a vertical direction, i.e. in a direction perpendicular to the semiconductor film, during the implantation of the dopant. Again by means of a subsequent thermal step, for example simultaneously with a dopant activation with changed parameters, a homogenization of the dopant concentration in vertical direction may be effected later. This, too, results in a change of the electric resistance of the resistive region, particularly in a reduction of the electric resistance.

A serious common disadvantage of the conventional ways described above for changing the electric resistance of a resistive device is that each thermal treatment has an effect on the whole substrate, or the whole semiconductor wafer, and devices possibly already formed or still to form therein. Therefore, temperature and duration of a thermal treatment cannot be varied arbitrarily, but must be kept within narrow limits. Accordingly, the electric resistance of a resistive device can only be changed within a very limited range in the ways described above. Furthermore, the described ways for changing the electric resistance of a resistive device are generally only applicable for resistive devices on the basis of semiconductor films on insulating layers which effectively prevent vertical diffusion. In the case of a resistive device formed in the substrate, the dopant would diffuse in a vertical direction and thus leave the space region provided for the resistive device.

Conventionally, a change of the electric resistance of an integrated semiconductor resistive device is therefore only possible within a limited resistance value range. In the case of technologies in which the electric resistance of the resistive devices varies more from wafer to wafer or from lot to lot, adjusting, or setting, the electric resistance to a desired value is therefore not possible.

SUMMARY OF THE INVENTION

The object of the present invention is to provide a resistive device and a method for its production allowing setting the electric resistance of the resistive device within a wide resistance value range.

In accordance with a first aspect, the present invention provides a resistive device with a resistive region made of a semiconductor material, including a first region and a second region, wherein the first region has a higher dopant concentration than the second region, and wherein a resistance-determining width of a current path through the first region is determined by a portion of a doping boundary between the first region and the second region.

In accordance with a second aspect, the present invention provides a method for producing a resistive device, having the steps of producing a resistive region of a semiconductor material; producing a first region with a first dopant concentration and a second region with a second dopant concentration that is lower than the first dopant concentration, in the resistive region; and heating the resistive device to shift, by diffusion of a dopant, a dopant boundary between the first region and the second region to change a resistance-determining width of a current path through the first region to change an electric resistance of the resistive device.

The present invention is based on the idea of arranging a first and a second region with different dopant concentrations within a resistive region of a resistive device, wherein a current path through the more highly doped first region is limited by a portion of a doping boundary between the first region and the second region and particularly the portion of the doping boundary determines the resistance-determining width of the current path through the first region. A thermally-induced diffusion of a dopant (particularly from the first region to the second region) causes (in addition to blurring the doping boundary) a shift of the doping boundary in the direction of the second region, or an enlargement of the first region and a reduction of the second region. This results in an increase in the resistance-determining width of the current path through the first region and thus a reduction of the electric resistance of the resistive device.

One advantage of the present invention is that by influencing the resistance-determining width of a current path through the more highly doped first region, a particularly effective change of the electric resistance of the resistive device is possible. The present invention thus allows a change of the electric resistance of the resistive device within a wide resistance value range. Thus, also with a wide spread of the original resistance values of resistive devices effected with simple and inexpensive technological means, a setting, or an adjustment, to a predetermined resistance value may be performed.

In accordance with a preferred embodiment, the second region having the lower dopant concentration is convex or, in particular, wedge-shaped at the portion of the doping boundary determining the resistance-determining width of the current path. Particularly a wedge-shaped second region or particularly a second region wedge-shaped at the portion of the doping boundary determining the resistance-determining width of the current path has the advantage that even a small shift of the doping boundary between the first region and the second region results in a significantly greater increase in the resistance-determining width of the current path through the first region.

In accordance with an embodiment, the first region is simply contiguous and the second region contiguous. Preferably, the second region extends primarily transverse to the basic current flow direction of the resistive device between the terminals thereof, wherein the resistance-determining width of the current path through the first region is equal to the total width of the resistive region minus the expansion of the second region.

In an alternative embodiment, the first region is multiply contiguous and the second region is non-contiguous. The second region consists of several contiguous sub-regions that are arranged substantially one after the other or, preferably, substantially next to one another in the direction of the basic current flow direction of the resistive device. Every single sub-region is, in turn, preferably implemented such that a shift of the doping boundary by a shift distance results in an increase in the resistance-determining width of the current path through the first region, that is larger than the shift distance.

The present invention is implementable both as a resistive device and a method for producing a resistive device.

Preferred further developments of the present invention are defined in the dependent claims.

BRIEF DESCRIPTION OF THE DRAWINGS

In the following, preferred embodiments of the present invention are explained in more detail with reference to the accompanying drawings, in which:

FIG. 1 shows a schematic top-view of a first embodiment of the present invention;

FIG. 2 shows a schematic top-view of the embodiment of FIG. 1 after a shift of the doping boundary;

FIG. 3 shows a schematic top-view of a second embodiment of the present invention; and FIG. 4 shows a schematic top-view of a resistive device with various alternative features in accordance with the present invention.

DESCRIPTION OF THE PREFERRED EMBODIMENTS

FIG. is a schematic top-view of a resistive device according to a first embodiment of the present invention. The resistive device includes a substantially rectangular resistive region of a semiconductor material that has been deposited preferably amorphously or polycrystallinely on a preferably diffusion-inhibiting insulating layer, preferably a semiconductor oxide layer. A crystalline layer mounted on a preferably diffusion-inhibiting insulating layer corresponding to the SOI technology is also employable. Highly doped contact strips 12, 14 are provided along two parallel sides of the resistive region 10 opposing each other. The resistive region 10 is connected electrically conducting with terminals 16, 18 via the highly doped contact strips 12, 14 and, if applicable, resistive contacts. The arrangement of the contact strips 12, 14 and the terminals 16, 18 determines a basic current flow direction in the resistive region 10.

The resistive region 10 includes a first region 22 and a second region 24 which is inserted like a wedge in the first region 22. The first region 22 has a first dopant concentration which is higher than a second dopant concentration of the second region 24. For example, the contact strips 12, 14 are $p^+$-doped, the first region 22 is $p^-$-doped and the second region 24 is undoped. The boundary between the first region 22 and the second region 24 will be referred to as doping boundary 26 in the following.

As the second region 24 has a dopant concentration which is lower, preferably significantly lower, than the dopant concentration of the first region 22, and is more preferably undoped, the second region 24 has a lower, or significantly lower, electric conductivity than the first region 22. An electric current between the terminal 16 and the contact strip 12 on the one hand and the contact strip 14 and the terminal 18 on the other hand accordingly flows mostly or nearly exclusively through the first region 22. The resistance of the resistive region 10 is therefore mainly or nearly exclusively determined by the specific conductivity and the geometry of the first region 22. Here, the resistance-determining dimension is the width B of the current path between the terminals 16, 18 at its narrowest point. The resistance-determining width B is, in turn, determined by a portion 30 of the doping boundary 26, or by the arrangement of this portion relative to the opposite side 32 of the resistive region 10. Corresponding to the wedge-shaped implementation of the second region 24, the portion 30 has an acute angle. In other words, two non-parallel sub-portions 34, 36 of the doping boundary 26 border on each other here in an acute angle.

The resistive device depicted in FIG. 1 is produced by forming first the resistive region 10 of a semiconductor material. For this, an insulating layer, preferably a semiconductor oxide or also a semiconductor nitride layer, is produced on a substrate. A semiconductor film is deposited amorphously or polycrystallinely on the insulating layer. Alternatively, a crystalline semiconductor layer is mounted on a preferably diffusion-inhibiting insulating layer by means of the SOI technology and subsequently structured. At first, this defined semiconductor region is doped only slightly or not at all.

Then the first region 22 with a first, higher dopant concentration and the second region 24 with a second, lower dopant concentration are produced in the semiconductor layer, or the semiconductor film. For this, preferably a dopant is incorporated into the semiconductor film by implantation wherein a mask covers the second region 24 to prevent an implantation of dopant in the second region 24 or to produce a lower concentration of the implanted dopant. Then, the implanted dopant is activated by heating and/or warming of the semiconductor film. During the activating, the dopant atoms are inserted into lattice positions of the semiconductor material and material defects produced in the semiconductor material during the implantation of the dopant are annealed. In a similar manner, the highly doped contact strips 12, 14 are produced.

Preferably, the second region 24 is not doped at all and thus remains with its original dopant concentration or, if applicable, as an undoped, intrinsic region.

Before, during or after producing the first region 22 and the second region 24 by a laterally structured doping, the resistive region 10 as a whole is laterally structured. For this, the semiconductor film of which the resistive region 10 is formed is preferably removed outside the resistive region 10. Controlled by a photo-resist or other mask and by etching, a trench is produced that surrounds the resistive region 10 and the contact strips 12, 14 completely and, in vertical direction, reaches to the insulating layer below. Alternatively, the semiconductor film outside the resistive region 10 is removed completely or is not produced from the very beginning.

After the described process steps, the resistive device has a particular electric resistance that is subject to a certain spread because of a never exactly definable production parameter. The deviation of the electric resistance from resistive device to resistive device within a wafer is generally low. Larger and large deviations occur between the resistance values of resistive devices on different wafers or even from different production lots. The electric resistance of one or more resistive devices on a wafer or within a production lot are measured. From this measuring value and its deviation from a predetermined set value, the parameters of the correction step described in the following are calculated or determined in another way. The effect of this correction step is illustrated in the following on the basis of FIG. 2.

FIG. 2 also depicts the resistive device illustrated above on the basis of FIG. 1 in a top-view. For a correction and/or adjustment and/or setting of the electric resistance of the resistive device, the same is exposed to a heat treatment. By heating the resistive device, a diffusion of the dopant from the first region 22 to the second region 24 is caused. Because of this diffusion, the doping boundary 26 between the first region 22 and the second region 24 is shifted. Thereby, the first region 22 grows at the expense of the second region 24 and a new (somewhat more vague) doping boundary 26' appears. By the shift of the doping boundary 26 by a shift distance V to the doping boundary 26', the portion 30 of the doping boundary 26 shifts by a magnitude, or a distance, S. The resistance-determining width correspondingly increases from B to B+S. The electric resistance of the resistive device correspondingly decreases. Additionally, the out-diffusion of the highly doped, preferably $p^{++}$-doped terminal regions, or contact strips 12, 14, must be taken into account, which also contributes to the change of the electric resistance of the resistive device. This contribution to the change of resistance, however, is smaller than the contribution of the shift of the doping boundary described above and the resulting increase in the resistance-determining width.

Because of the convexity of the doping boundary 26 and, particularly, of the portion 30 of the doping boundary 26, the distance S by which the resistance-determining width increases is greater than the shift distance V. It is apparent that, because of the acute-angled or wedge-shaped implementation of the second region 24 and, particularly, of the portion 30 of the doping boundary 26, the distance S is significantly larger than the shift distance V. By an appropriate dimensioning, in particular a particularly acute angle, the distance S may be a multiple of the shift distance V. With a small shift of the doping boundary 26 that may be achieved with a relatively short-term exposure to temperature, a relatively large change of the resistance-determining width B to B+S and thus a relatively large change of the electric resistance of the resistive device may thus be achieved.

FIG. 3 is a schematic top-view of a resistive device according to a further preferred embodiment of the present invention. The resistive device illustrated in the following on the basis of FIG. 3 differs from the resistive device illustrated above on the basis of FIGS. 1 and 2 in that the second region 24 consists of two non-contiguous sub-regions 24a, 24b. The second region 24 and/or its sub-regions 24a, 24b are arranged symmetrically relative to the basic current direction of the resistive device between the terminals 16, 18 and/or the contact strips 12, 14. Each of the sub-regions 24a, 24b of the second sub-region 24 is wedge—or triangle-shaped and borders on an edge 32a, 32b of the resistive device with one side. Here, the resistance-determining width B of the first region 22 is not, as in the embodiment illustrated above on the basis of FIGS. 1 and 2, the distance between the tip and/or the portion 30 of the doping boundary 26 of the second region 24 on the one hand and the opposite side 32, but the distance between tips and/or portions 30a, 30b of the doping boundaries 26a, 26b of the sub-regions 24a, 24b of the second region 24. Although a situation after a shift of the doping boundary 26a, 26b by a shift distance V is not illustrated here, it is easily apparent from a joint view of FIGS. 2 and 3 that such a shift results in a change of the resistance-determining width from B to B+2S. The effect of the shift of the doping boundary 26a, 26b by the shift distance V in the embodiment illustrated on the basis of FIG. 3 is thus even larger than in the embodiment illustrated above on the basis of FIGS. 1 and 2.

From the embodiments illustrated up to now on the basis of FIGS. 1–3, the basic idea of the present invention is apparent. By a combination of a design, or a lateral shape, of the first region 22 and the second region 24, respectively, of the resistive region 10 and an annealing step, the electric resistance of the resistive device may be changed considerably in value with a short thermal treatment and/or an annealing within a particularly short time. For this, the resistive device is originally designed such that, without annealing, it has a resistance value that is reliably, i.e. also considering production tolerances, higher than a set value, preferably, however, as near to the set value as possible. The resistive device is annealed in the wafer compound preferably at the end of the front, or first, portion of the semiconductor production line (front and off line) by means of RTA (rapid thermal annealing) or using a vertical oven. The annealing allows and causes a (further) out-diffusion of the dopant and thus the enlargement of the more highly doped first region 22 described above at the expense of the lower-doped second region 24 of the resistive region 10.

The conical or wedge-shaped or triangular design, shown in the embodiments described above on the basis of FIGS. 1–3, of the second region 24 or also several non-contiguous sub-regions 24a, 24b of the sub-region 24 allows a particularly noticeable change of the resistance-determining width B and hence of the electric resistance of the resistive device with a shift of the doping boundary 26; 26a, 26b by a particularly small shift distance V. The present invention thus allows a continuous adjustment of the resistance value of the resistive device according to the invention to a target value and/or set value within a relatively wide range. The use of single wafer processing for example the mentioned RTA, allows a wafer-fine post-processing, by which variations from wafer to wafer and/or from lot to lot are compensated.

It is apparent that the relationship between the distance S, by which the resistance-determining width B grows, and the shift distance V, by which the doping boundary 26 is shifted, is the larger, the acuter the angle between the two sub-portions 34, 36 of the portion 30 is and/or the flatter the triangles) is/are whose form the second region 24 has. The basic idea of the present invention, however, is also implemented by various variations and modifications of the embodiments illustrated on the basis of FIGS. 1–3, which, in the following, are illustrated in the form of some examples.

In contrast to the illustrations in FIGS. 1–3, the highly doped contact strips 12 and the second region 24 may, for example, border on each other. This has the advantage that, because of the high dopant density of the contact strip 12, the portion of the doping boundary 26, that borders on the contact strip 12, is shifted particularly fast and/or particularly far during annealing This arrangement thus means a further improvement with regard to the embodiments illustrated on the basis of FIGS. 1–3 in so far as, with the annealing at lower temperatures or within a shorter time, a shift of the doping boundary by a larger shift distance V and hence a change of the resistance-determining width B by a larger distance S to B+S and hence, in turn, a larger change of resistance of the resistive device may be achieved.

In the embodiments illustrated above on the basis of FIGS. 1–3, the doping boundary 26 is comprised of (approximately) straight portions, corresponding to the triangular shape of the second region 24. By a deviation of the shape of the doping boundary 26 from the triangular shape, a mathematical relation $S=f(V)$ between the shift distance V and the distance S by which the resistance-determining width B is changed may be achieved. By a convex or concave redesigning of the doping boundary 26 relative to the triangular shape, it may be achieved that the resistance-determining width B changes more for small shift distances V and less for larger shift distances V or, reversely, changes less for small shift distances v and more for larger shift distances V.

The second region 24, however, does not have to have approximately the shape of a triangle. Rather, basically every design, that is substantially convex or is at least convex at the portion 30 of the doping boundary 26 that determines the resistance-determining width B of the current path is particularly advantageous as the distance S by which the resistance-determining B grows is larger than the shift distance V by which the doping boundary 26 is shifted. The first region 22 of the resistive region 10 may be simply or multiply contiguous, the second region 24 of the resistive region 10 may be contiguous or non-contiguous.

The change of the electric resistance of the resistive device caused by the change of the resistance-determining width B by the distance S is the larger, the larger the difference of the dopant concentrations in the first region 22 and the second region 24 is. Therefore, the second region 24 is preferably undoped and/or formed of an intrinsic semiconductor.

FIG. 4 is a schematic illustration of features of different possible variations of the shaping of the second region 24 illustrated above on the basis of FIGS. 1–3. In FIG. 4, four different examples for the shaping of the second region 24 or of individual sub-regions of the second region 24 are illustrated in top-view. These different shapings of the second region 24 or its sub-regions may be implemented either individually or simultaneously in the resistive device. The resistive device according to the invention also includes one or more of the sub-regions 24a, 24c, 24d, 24f illustrated in FIG. 4, that are identical with or different from each other. In the case of several sub-regions 24a, 24c, 24d, 24f, these may be arranged, as illustrated in FIG. 4, relative to the basic current direction between the terminals 16, 18, next to one another and/or substantially along a straight line perpendicular to the basic current direction. This has the advantage that there is a narrow passage between each two of the sub-regions 24a, 24c, 24d, 24f, like in the embodiment illustrated above on the basis of FIG. 3, wherein the widths of all these passages determine the resistance of the resistive device. Alternatively, the sub-regions 24a, 24c, 24d, 24f are staggered and/or shifted relative to each other in a direction parallel to the basic current direction.

The sub-region 24c has the shape of an isosceles triangle whose axis of symmetry is arranged parallel to the basic current direction between the terminals 16, 18. The sub-region 24d has the shape of a square or, more generally, of a rhombus, wherein the connection line between two opposite corners is arranged parallel to the basic current direction. The sub-region 24f has the shape of a narrow rectangle whose longer sides are arranged perpendicular to the basic current direction. With this shape of the sub-region 24f, a further aspect is added to the geometrical effect of the annealing illustrated above particularly on the basis of FIG. 2, once the shift distance V of the doping boundary 26f reaches approximately half of the length L of the sub-region 24 measured in a direction parallel to the basic current direction. Once dopant atoms from the first region 22 have reached substantially every point within the sub-region 24f, a considerable part of the current between the terminals 16, 18 flows through the then doped sub-region 24f. The resistance of the resistive device then depends on the amount of the dopant diffused from the first region 22 into the sub-region 24f. In the borderline case of a very intensive annealing, the dopant concentration in the sub-region 24f of the second region 24 will adjust itself substantially to the dopant concentration in the first region 22.

Directly after the implantation of the dopant in the semiconductor film that in the following forms the resistive region 10, the doping boundary 26 is sharply defined by the used mask. During the subsequent activating of the doping, a diffusion of the dopant from the first region 22 into the second region 24 already occurs to an extent preferably as small as possible. This is accompanied by a slight shift and a slight blurring of the doping boundary 26. During the following annealing of the resistive device according to the invention for the purpose of setting the electric resistance value, a further blurring of the same occurs, besides the described shifting of the doping boundary 26 to doping boundary 26'. The doping boundary 26, 26' is advantageously defined as the set of locations within the resistive region 10 where the local dopant concentration or the local specific resistance have a predetermined value. For example, the doping boundary may be defined as the set of locations where the dopant concentration exhibits the arithmetic or geometric average of the dopant concentrations far within the first region 22 and far within the second region 24. The basic concept, the principle of effect, the advantages and the illustrated embodiments of the present invention, however, are independent of the precise definition of the doping boundary.

The resistive device according to the invention is preferably implemented as a film device and/or a device with a vertical extension that is considerably smaller than its horizontal extensions. Expressed a little more generally, the present invention is preferably employed in completely diffused and geometrically limited, particularly laterally limited, semiconductor resistive devices. A diffusion-inhibiting layer below is not necessary, if the thickness of the preferably completely diffused resistive layer is significantly larger than the diffusion length, or the distance V by which the doping boundary is shifted. In this case, because of the vertical diffusion, the change of the dopant density may be approximately neglected and/or has less influence than the lateral shift of the doping boundary described above.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A resistive device comprising:
    a resistive region made of a semiconductor material including a first region and a second region wherein the first region has a higher dopant concentration than the second region; and
    wherein a resistance-determining width of a current path through the first region is determined by a portion of a dopant boundary between the first region and the second region; and,
    wherein the portion of the doping boundary that determines the resistance-determining width of the current path includes two non-parallel sub-portions.

2. The resistive device of claim 1, wherein the second region on the portion of the doping boundary that determines the resistance-determining width of the current path is convex.

3. The resistive device of claim 1, wherein the second region at the portion of the doping boundary that determines the resistance-determining width of the current path is wedge-shaped.

4. The resistive device of claim 1, wherein the first region is simply or multiply contiguous.

5. The resistive device of claim 1, wherein the second region is contiguous or non-contiguous.

6. The resistive device of claim 1, wherein the second region is undoped.

7. The resistive device of claim 4, wherein the resistive region includes a semiconductor film on an insulating layer.

8. A resistive device comprising:
    a resistive region made of a semiconductor material including a first region and a second region wherein the first region has a higher dopant concentration than the second region; and
    wherein a resistance-determining width of a current path through the first region is determined by a portion of a dopant boundary between the first region and the second region; and
    wherein the portion of the doping boundary that determines the resistance-determining width of the current path has an acute angle.

9. The resistive device of claim 8, wherein the second region on the portion of the dopant boundary that determines the resistance-determining width of the current path is convex.

10. The resistive device of claim 8, wherein the second region at the portion of the doping boundary that determines the resistance-determining width of the current path is wedge-shaped.

11. The resistive device of claim 8, wherein the first region is simply or multiply contiguous.

12. The resistive device of claim 8, wherein the second region is contiguous or non-contiguous.

13. The resistive device of claim 8, wherein the second region is undoped.

14. A resistive device comprising:
    a resistive region made of a semiconductor material including a first region and a second region wherein the first region has a higher dopant concentration than the second region; and
    wherein a resistance-determining width of a current path through the first region is determined by a portion of a dopant boundary between the first region and the second region; and
    wherein the second region has a width measured perpendicular to a basic current flow direction of the resistive device that is larger than a length measured parallel to the basic current flow direction.

15. A resistive device comprising:
    a resistive region made of a semiconductor material including a first region and a second region wherein the first region has a higher dopant concentration than the second region; and
    wherein a resistance-determining width of a current path through the first region is determined by a portion of a dopant boundary between the first region and the second region; and
    wherein the doping boundary is shiftable towards the second region by a thermally-induced diffusion of a dopant.

16. The resistive device of claim 15, wherein a shift of the doping boundary by a shift distance results in an increase in the resistance-determining width of the current path through the first region that is larger than the shift distance.

17. A resistive device formed in a semiconductor material, the resistive device comprising:
    a. a first contact strip;
    b. a second contact strip;
    c. a first region positioned between the first contact strip and the second contact strip, the first region having a first dopant concentration; and
    d. a second region positioned between the first contact strip and the second contact strip, the second region having a second dopant concentration that is less than the first dopant concentration, the perimeter of the second region defining a dopant boundary;

wherein a resistance determining width is defined in the first region by the dopant boundary, and a current path is formed between the first contact strip and the second contact strip through the first region and the resistance determining width; and wherein the dopant boundary borders the first contact strip.

18. The resistive device of claim 17 wherein the second region is undoped.

19. A resistive device formed in a semiconductor material, the resistive device comprising:
 a. a first contact strip;
 b. a second contact strip;
 c. a first region positioned between the first contact strip and the second contact strip, the first region having a first dopant concentration; and
 d. a second region positioned between the first contact strip and the second contact strip, the second region having a second dopant concentration that is less than the first dopant concentration, the perimeter of the second region defining a dopant boundary;

wherein a resistance determining width is defined in the first region by the dopant boundary, and a current path is formed between the first contact strip and the second contact strip through the first region and the resistance determining width; and wherein the dopant boundary is shiftable towards the second region by a thermally induced diffusion of a dopant.

20. A resistive device formed in a semiconductor material, the resistive device comprising:
 a. a first contact strip;
 b. a second contact strip;
 c. a first region positioned between the first contact strip and the second contact strip, the first region having a first dopant concentration; and
 d. a second region positioned between the first contact strip and the second contact strip, the second region having a second dopant concentration that is less than the first dopant concentration, the perimeter of the second region defining a dopant boundary;

wherein a resistance determining width is defined in the first region by the dopant boundary, and a current path is formed between the first contact strip and the second contact strip through the first region and the resistance determining width; and wherein the second region comprises a plurality of non-contiguous sub-regions, and the resistance determining width is located between the plurality of non-contiguous sub-regions.

* * * * *